(12) United States Patent
Lin et al.

(10) Patent No.: US 12,080,557 B2
(45) Date of Patent: Sep. 3, 2024

(54) METHOD FOR FORMING 2-D MATERIAL SEMICONDUCTOR DEVICE WITH IMPROVED SOURCE/DRAIN ELECTRODES AND GATE DIELECTRIC

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Shih-Yen Lin, Tainan (TW); Po-Cheng Tsai, Taichung (TW); Yu-Wei Zhang, Hualien County (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 75 days.

(21) Appl. No.: 17/461,714

(22) Filed: Aug. 30, 2021

(65) Prior Publication Data
US 2023/0061260 A1    Mar. 2, 2023

(51) Int. Cl.
*H01L 21/28* (2006.01)
*H01L 21/02* (2006.01)
(Continued)

(52) U.S. Cl.
CPC .... *H01L 21/28194* (2013.01); *H01L 21/0228* (2013.01); *H01L 21/02477* (2013.01);
(Continued)

(58) Field of Classification Search
CPC ........... H01L 21/28194; H01L 21/0228; H01L 21/02477; H01L 21/823462; H01L 29/42364; H01L 29/78
See application file for complete search history.

(56) References Cited

U.S. PATENT DOCUMENTS

| 6,905,939 B2 * | 6/2005 | Yuan | .................. H01L 21/0228 |
| | | | 257/E21.279 |
| 2003/0161951 A1 * | 8/2003 | Yuan | ................. H01L 21/31612 |
| | | | 257/E21.279 |

(Continued)

FOREIGN PATENT DOCUMENTS

CN    111969058 A  * 11/2020    ............. H01L 21/44

OTHER PUBLICATIONS

Chong-Rong Wu et al., "Establishment of 2D Crystal Heterostructures by Sulfurization of Sequential Transition Metal Depositions: Preparation, Characterization, and Selective Growth." Nano Letters, vol. 16, Oct. 20, 2016, pp. 7093-7097.

(Continued)

*Primary Examiner* — Thao X Le
*Assistant Examiner* — Sean Ayers Winters
(74) *Attorney, Agent, or Firm* — Maschoff Brennan

(57) ABSTRACT

A method includes forming a 2-D material semiconductor layer over a substrate; forming source/drain electrodes covering opposite sides of the 2-D material semiconductor layer, while leaving a portion of the 2-D material semiconductor layer exposed by the source/drain electrodes; forming a first gate dielectric layer over the portion of the 2-D material semiconductor layer by using a physical deposition process; forming a second gate dielectric layer over the first gate dielectric layer by using a chemical deposition process, in which a thickness of the first gate dielectric layer is less than a thickness of the second gate dielectric layer; and forming a gate electrode over the second gate dielectric layer.

20 Claims, 19 Drawing Sheets

(51) Int. Cl.
H01L 21/8234 (2006.01)
H01L 29/423 (2006.01)
H01L 29/78 (2006.01)

(52) U.S. Cl.
CPC ........... H01L 21/823462 (2013.01); H01L 29/42364 (2013.01); H01L 29/78 (2013.01)

(56) References Cited

U.S. PATENT DOCUMENTS

| | | | | |
|---|---|---|---|---|
| 2014/0001570 A1* | 1/2014 | Brodsky | ............... | H01L 29/517 257/E27.06 |
| 2015/0108475 A1* | 4/2015 | Ando | .................... | C23C 14/086 257/43 |
| 2016/0308060 A1* | 10/2016 | Tanaka | ............... | H01L 29/78606 |
| 2017/0345944 A1 | 11/2017 | Lin et al. | | |
| 2020/0006541 A1* | 1/2020 | Lin | ................... | H01L 29/66969 |
| 2020/0279851 A1* | 9/2020 | Endo | ....................... | H01L 29/24 |

OTHER PUBLICATIONS

Kuan-Chao Chen et al., "Layer Number Controllability of Transition-Metal Dichalcogenides and the Establishment of Hetero-Structures by Using Sulfurization of Thin Transition Metal Films." Journal of Physics D: Applied Physics, vol. 50, Jan. 11, 2017, 064001 (6pp).
Hsuan-An Chen et al., "Single-Crystal Antimonene Films Prepared by Molecular Beam Epitaxy: Selective Growth and Contact Resistance Reduction of the 2D Material Heterostructure." ACS Applied Materials & Interfaces, vol. 10, Apr. 13, 2018, pp. 15058-15064.

* cited by examiner

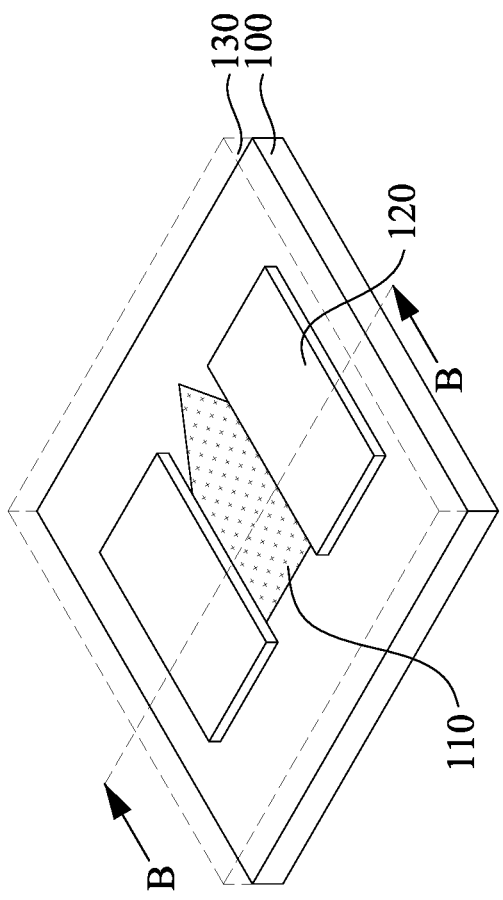
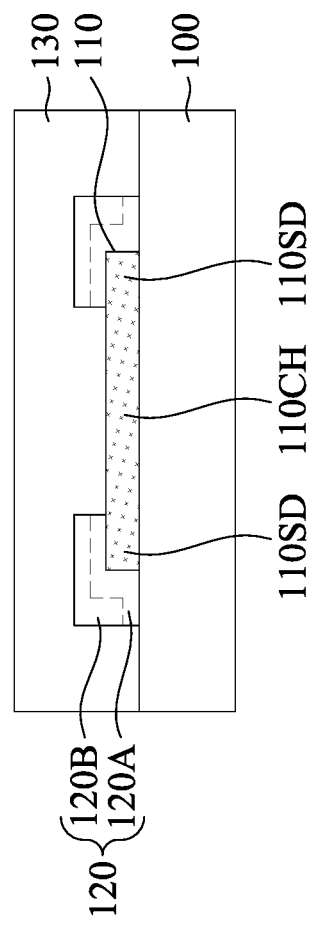
Fig. 3A
Fig. 3B

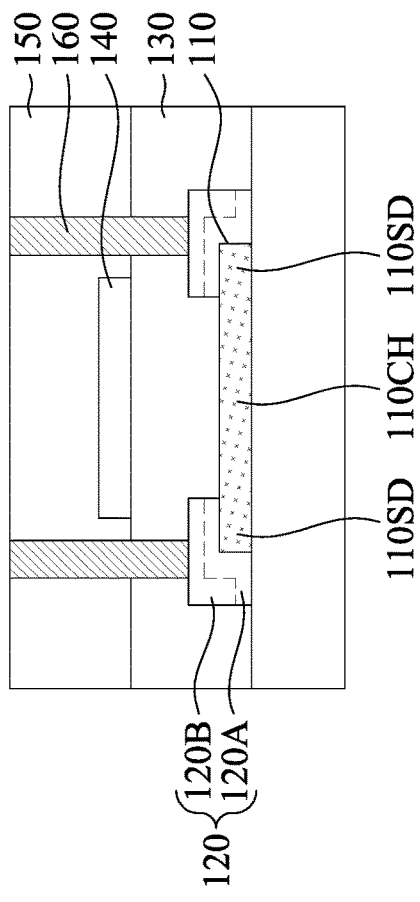
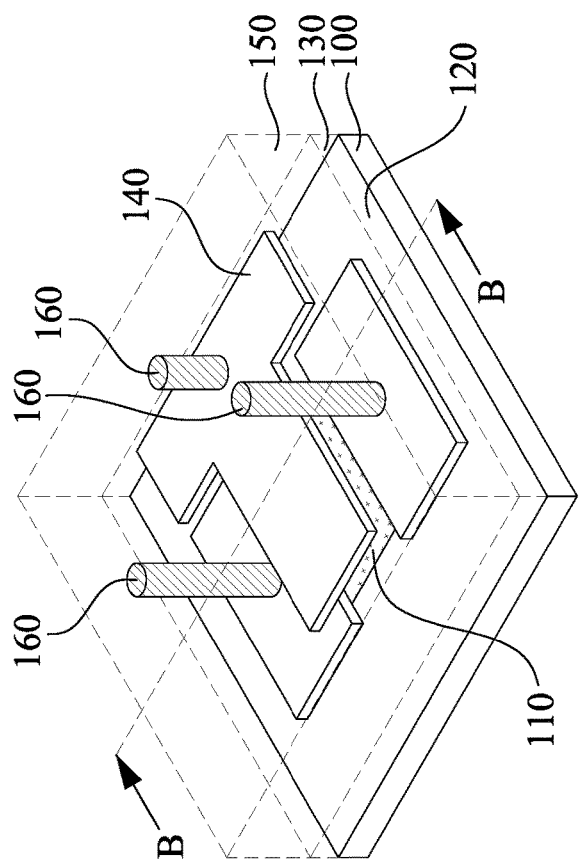
Fig. 5A
Fig. 5B

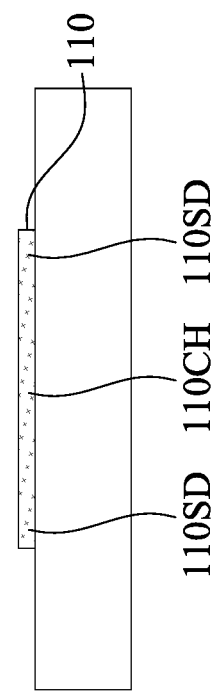
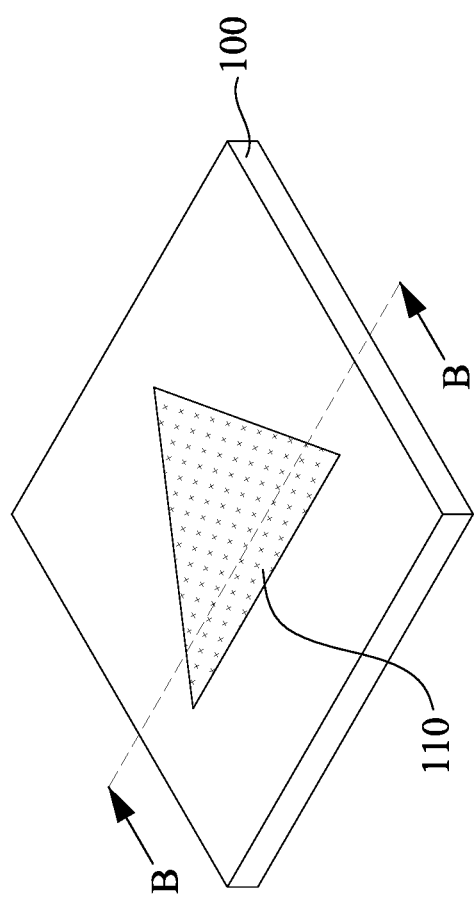

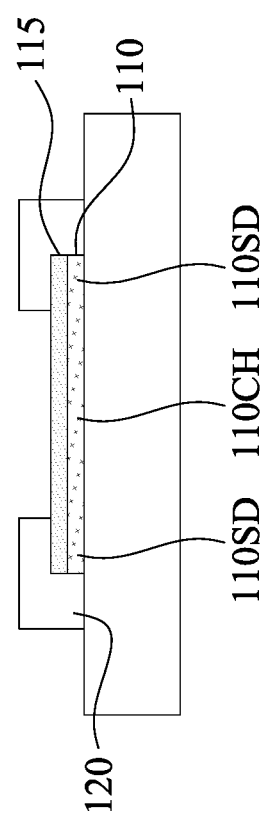
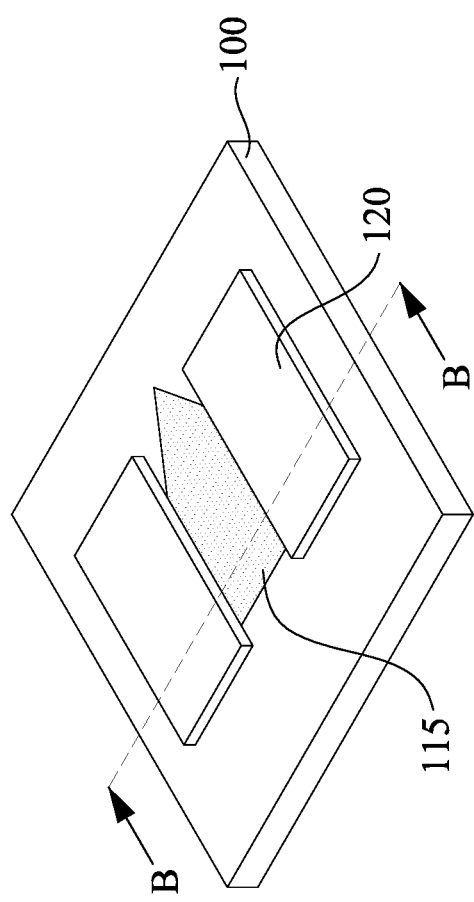
Fig. 14B
Fig. 14A

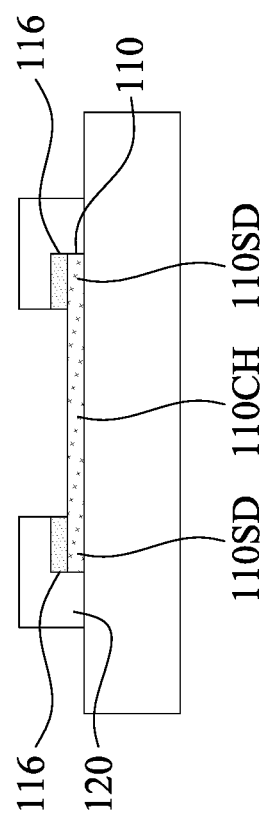
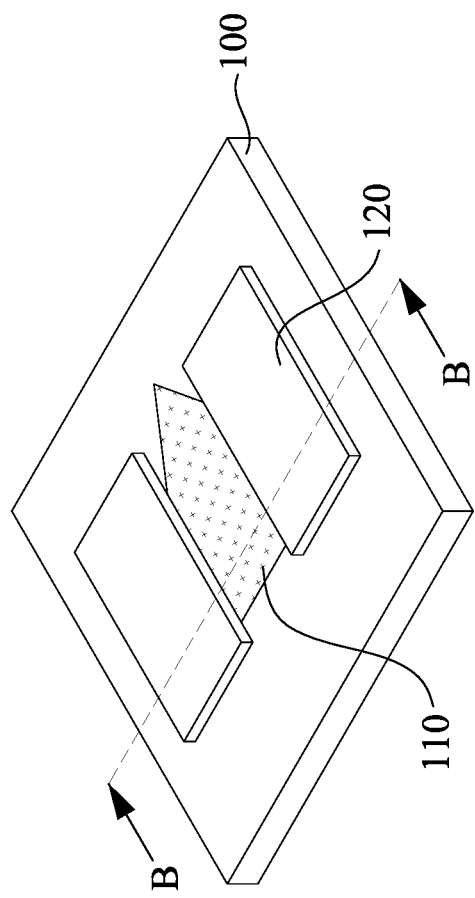
Fig. 15A
Fig. 15B

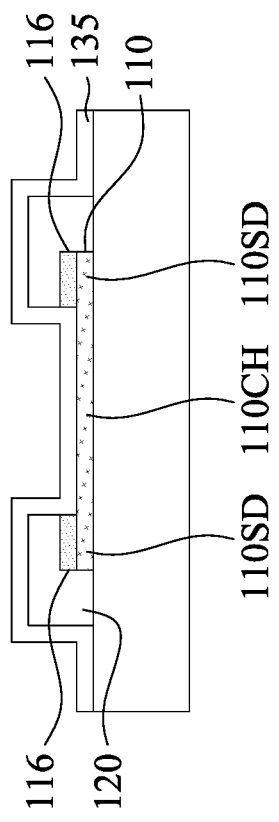
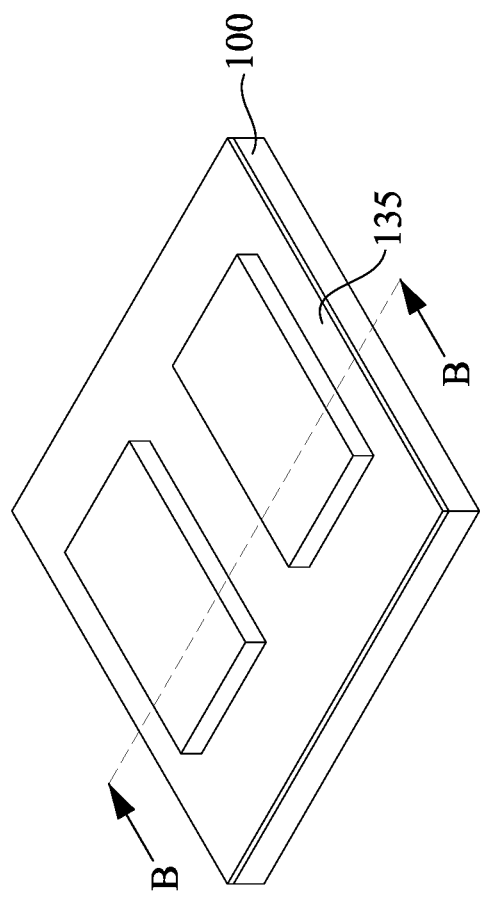
Fig. 16A
Fig. 16B

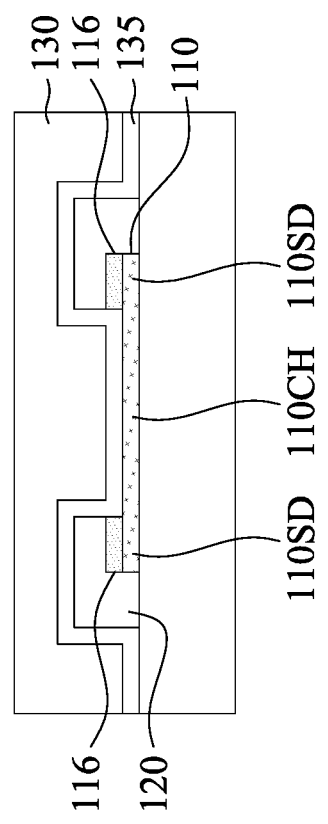
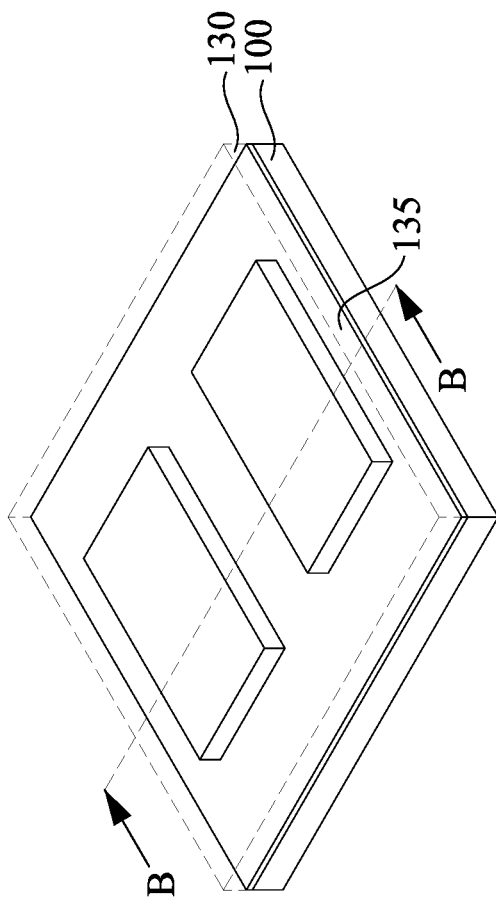
Fig. 17A
Fig. 17B

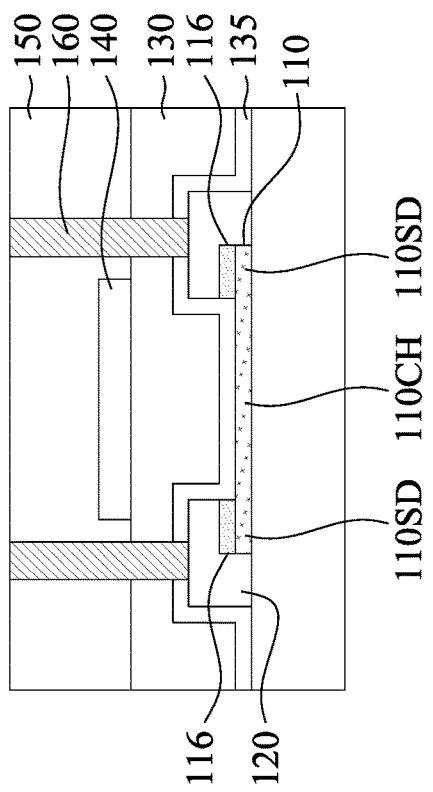
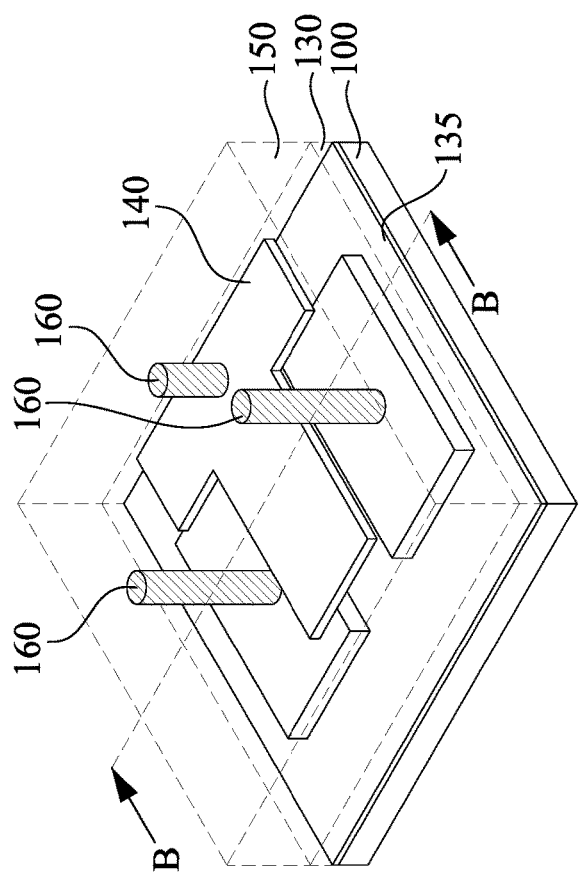
Fig. 18B
Fig. 18A

US 12,080,557 B2

METHOD FOR FORMING 2-D MATERIAL SEMICONDUCTOR DEVICE WITH IMPROVED SOURCE/DRAIN ELECTRODES AND GATE DIELECTRIC

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 5B are cross-sectional views of a memory device in various stages of fabrication in accordance with some embodiments of the present disclosure.

FIGS. 12A to 18B are cross-sectional views of a memory device in various stages of fabrication in accordance with some embodiments of the present disclosure.

DETAILED DESCRIPTION

Figure 1A:
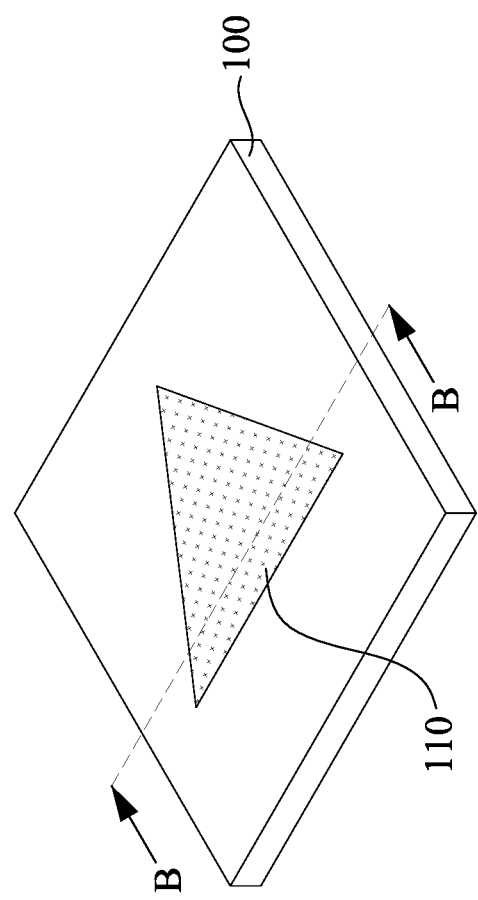

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 5B are cross-sectional views of a memory device in various stages of fabrication in accordance with some embodiments of the present disclosure. Although the views shown in FIGS. 1A to 5B are described with reference to a method, it will be appreciated that the structures shown in FIGS. 1A to 5B are not limited to the method but rather may stand alone separate of the method. Although FIGS. 1A to 5B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 1B:
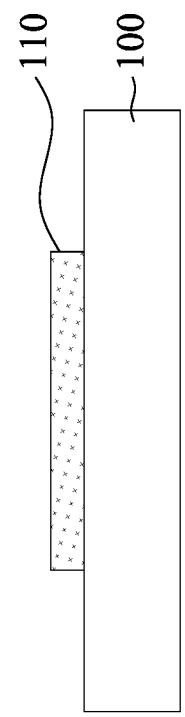

Reference is made to FIGS. 1A and 1B, in which FIG. 1A is a perspective view of a semiconductor device, and FIG. 1B is a cross-sectional view along line B-B of FIG. 1A. An initial structure includes a substrate 100. In some embodiments, the substrate 100 may function to provide mechanical and/or structure support for features or structures that are formed in the subsequent steps of the process flow illustrated in FIGS. 2A to 5B. These features or structures may be parts or portions of a semiconductor device (e.g. a transistor) that may be formed on or over the substrate 100.

The substrate 100 may be a semiconductor substrate. For example, the substrate 100 may include sapphire (e.g. crystalline $Al_2O_3$), e.g. a large grain or a single crystalline layer of sapphire or a coating of sapphire. As another example, the substrate 100 may be a sapphire substrate, e.g. a transparent sapphire substrate comprising, as an example, $\alpha\text{-}Al_2O_3$. Other elementary semiconductors like germanium may also be used for substrate 100. Alternatively or additionally, substrate 100 includes a compound semiconductor such as silicon carbide, gallium arsenide, indium arsenide, indium gallium arsenide (InGaAs) and/or indium phosphide. Further, substrate 100 may also include a silicon-on-insulator (SOI) structure. Substrate 100 may also be other suitable substrates, which are all included in the disclosure and non-limiting. Substrate 100 may include an epitaxial layer and/or may be strained for performance enhancement. Substrate 100 may also include various doping configurations depending on design requirements, such as p-type substrate and/or n-type substrate and various doped regions such as p-wells and/or n-wells.

A 2-D material layer 110 is formed over the substrate 100. In some embodiments, the 2-D material layer 110 is in direct contact with the top surface of the substrate 100. As used herein, consistent with the accepted definition within solid state material art, a "2-D material" may refer to a crystalline material consisting of a single layer of atoms. As widely accepted in the art, "2-D material" may also be referred to as a "monolayer" material. In this disclosure, "2-D material" and "monolayer" material are used interchangeably without differentiation in meanings, unless specifically pointed out otherwise.

The 2-D material layer 110 may be 2-D materials of suitable thickness. In some embodiments, a 2-D material includes a single layer of atoms in each of its monolayer structure, so the thickness of the 2-D material refers to a number of monolayers of the 2-D material, which can be one monolayer or more than one monolayer. The coupling between two adjacent monolayers of 2-D material includes van der Waals forces, which are weaker than the chemical bonds between/among atoms within the single monolayer.

Formation of the 2-D material layer 110 may include suitable processes depending on the 2-D material layer 110 and the substrate 100. In some embodiments, the 2-D material layer 110 includes a transition metal dichacogenide (TMD) monolayer material. In some embodiments, a TMD monolayer includes one layer of transition metal atoms sandwiched between two layers of chalcogen atoms. Substrate 100 may include any substrates that are suitable for the formation of the TMD monolayers thereover. For example, substrate 100 may be selected based on its capacity to sustain the potential high temperature in the formation of the TMD monolayers thereover. In some embodiments, a sapphire substrate 100 is used.

In some embodiment where the 2-D material layer 110 is TMD monolayers, the TMD monolayers include molybdenum disulfide ($MoS_2$), tungsten disulfide ($WS_2$), tungsten diselenide ($WSe_2$), or the like. In some embodiments, $MoS_2$ and $WS_2$ may be formed on the substrate 100, e.g., a sapphire substrate, using suitable approaches. For example, $MoS_2$ and $WS_2$ may be formed by micromechanical exfoliation and coupled over the substrate 100, or by sulfurization of a pre-deposited molybdenum (Mo) film or tungsten (W) film over the substrate 100. In alternative embodiments, $WSe_2$ may be formed by micromechanical exfoliation and coupled over the substrate 100, or by selenization of a pre-deposited tungsten (W) film over the substrate 100 using thermally cracked Se molecules.

In some embodiments, forming of the 2-D material layer 110 also includes treating the 2-D material layer 110 to obtain expected electronic properties of the 2-D material layer 110. The treating processes include thinning (namely, reducing the thickness of the 2-D material layer 110), doping, or straining, to make the 2-D material layer 110 exhibit certain semiconductor properties, e.g., including direct bandgap. The thinning of the 2-D material layer 110 may be achieved through various suitable processes, and all are included in the present disclosure. For example, plasma based dry etching, e.g., reaction-ion etching (RIE), may be used to reduce the number of monolayers of the 2-D material layer 110.

In the description hereinafter, the 2-D material layer 110 may include semiconductor properties (interchangeably referred to as semiconductor 2-D material layer in this context). In some embodiments, each monolayer of $MoS_2$ is about 6.5 angstrom (Å) to about 7.5 Å in thickness (e.g., 7.0 Å) in thickness. In some embodiments, the thickness of the $MoS_2$ 2-D material layer 110 is in a range from about 0.7 nm to about 7 nm, namely about 1 to about 10 monolayers of $MoS_2$. In some embodiments, each monolayer of $WSe_2$ is about 6.5 angstrom (A) to about 7.5 Å in thickness (e.g., 7.0 Å) in thickness. In some embodiments, the thickness of the $WSe_2$ 2-D material layer 110 is in a range from about 0.7 nm to about 7 nm, namely about 1 to about 10 monolayers of $WSe_2$.

Figure 2B:
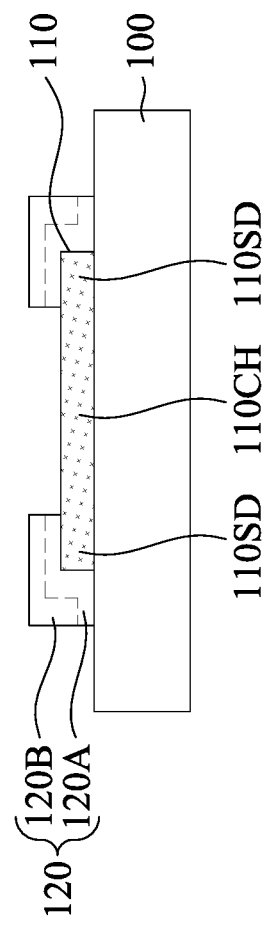
Figure 2A:
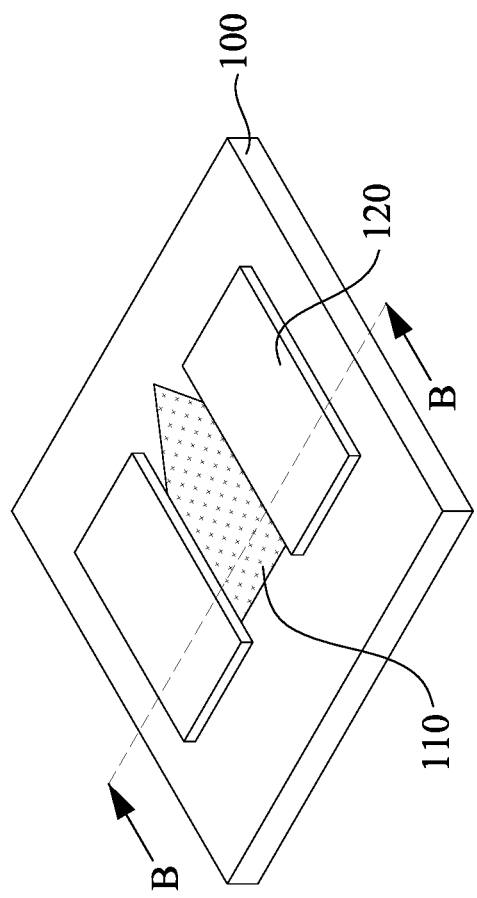

Reference is made to FIGS. 2A and 2B, in which FIG. 2A is a perspective view of a semiconductor device, and FIG. 2B is a cross-sectional view along line B-B of FIG. 2A. Source/drain metals 120 are formed on opposite sides of the 2-D material layer 110. In some embodiments, each of the source/drain metals 120 includes a first metal layer 120A and a second metal layer 120B over the first metal layer 120A. In some embodiments, portions of the 2-D material layer 110 covered by the source/drain metals 120 can be referred to as source/drain regions 110SD, and a portion of the 2-D material layer 110 between the source/drain metals 120 (or the source/drain regions 110SD) can be referred to as channel region 110CH. The source/drain metals 120 may be formed through sputtering or other suitable processes like CVD, PVD, plating, or other suitable process.

In some embodiments, the first metal layer 120A may serve as a separation metal layer, which is used to separate the 2-D material layer 110 from the second metal layer 120B, such that the second metal layer 120B would not contact the 2-D material layer 110. In some embodiments where the first metal layer 120A is omitted, the 2-D material layer 110 would be in contact with the second metal layer 120B. In that scenario, the second metal layer 120B may form alloy with the 2-D material layer 110 during deposition of the second metal layer 120B, which might deteriorate the 2-D crystal structure of the 2-D material layer 110. Accordingly, the material of the first metal layer 120A is selected such that the material would not form an alloy with the 2-D material layer 110. In some embodiments, the first metal layer 120A may include metal such as gold (Au), aluminum (Al), bismuth (Bi), cadmium (Cd), chromium (Cr), iridium (Ir), niobium (Nb), tantalum (Ta), tellurium (Te), tungsten (W), or other suitable metal.

In some embodiments, the second metal layer 120B may be formed of suitable electrically conductive material, including polysilicon, graphene, and metal including one or more layers of aluminum (Al), copper (Cu), titanium (Ti), tantalum (Ta), tungsten (W), cobalt (Co), molybdenum (Mo), nickel (Ni), manganese (Mg), silver (Ag), palladium (Pd), rhenium (Re), iridium (Ir), ruthenium (Ru), platinum (Pt), zirconium (Zr), tantalum nitride (TaN), nickel silicide (NiSi), cobalt silicide (CoSi), TiN, WN, TiAl, TiAlN, TaCN, TaC, TaSiN, metal alloys, other suitable materials, and/or combinations thereof.

In some embodiments, the area of each of the source/drain metals 120 is about 80×80 $\mu m^2$. In some embodiments, the first metal layer 120A of the source/drain metals 120 may be gold (Au) having a thickness in a range from about 90 nm to about 110 nm (e.g., about 100 nm in some embodiments). In some embodiments, the second metal layer 120B of the source/drain metals 120 may be titanium (Ti) having a thickness in a range from about 8 nm to about 12 nm (e.g., about 10 nm in some embodiments). In some embodiments, the first metal layer 120A is thicker than the second metal layer 120B, ensuring that the second metal layer 120B would not form alloy with the 2-D material layer 110. For example, the ratio of the first metal layer 120A to the second metal layer 120B may be in a range from about 9 to 14. In some embodiments, the first metal layer 120A is made of Au and the second metal layer 120B is made of Ti, and the thickness of the first metal layer 120A is about 100 nm and the thickness of the second metal layer 120B is about 10 nm.

In some embodiments, the source/drain metals 120 may be formed by, for example, depositing a photoresist layer over the substrate 100 by suitable process, such as spin-coating technique, which may include baking the photoresist layer after coating. The photoresist layer may include positive-type or negative-type resist materials. For example, the photoresist layer include poly(methylmethacrylate) (PMMA). Then, the photoresist layer is subjected to an exposure process. Afterward, the photoresist layer is developed by a suitable process. For example, the photoresist layer is exposed to a developing solution, such as tetramethylammonium hydroxide (TMAH), to remove portions of the photoresist layer to form the openings that expose the source/drain regions 110SD of the 2-D material layer 110. Next, a first conductive material of the first metal layer 120A and a second conductive material of the second metal layer 120B are sequentially deposited over the substrate 100 by suitable process, such as thermal evaporation, sputtering, PVD, or the like. Afterward, portions of the first conductive material and the second conductive material over the top surface of the photoresist layer are lifted off together with the photoresist layer, such that other portions of the first conductive material and the second conductive material in the openings remain over the substrate 100. The remaining portions of the first conductive material and the second conductive material denote the first metal layer 120A and the second metal layer 120B of the source/drain metals 120, respectively. In some other embodiments, the source/drain metals 120 may be formed by, for example, depositing a first conductive material of the first metal layer 120A and a second conductive material of the second metal layer 120B are sequentially deposited over the substrate 100, and performing a patterning process to remove unwanted portions of the first conductive material and the second conductive material. The remaining portions of the first conductive material and the second conductive material denote the first metal layer 120A and the second metal layer 120B of the source/drain metals 120, respectively.

Reference is made to FIGS. 3A and 3B, in which FIG. 3A is a perspective view of a semiconductor device, and FIG. 3B is a cross-sectional view along line B-B of FIG. 3A. A dielectric layer 130 is formed over the substrate 100. In some embodiments, the dielectric layer 130 extends along the top surface of the substrate 100, sidewalls and top surfaces of the source/drain metals 120, and the top surface of the channel region 110CH of the 2-D material layer 110. In some embodiments, the dielectric layer 130 includes a portion 130CH in contact with the channel region 110CH of the 2-D material layer 110, and the portion 130CH may serve as a gate dielectric layer in the final structure. Accordingly, the portion 130CH of the dielectric layer 130 may interchangeably referred to as gate dielectric layer 130CH in this context. In some embodiments, the dielectric layer 130 may be formed of aluminum oxide ($Al_2O_3$), while other suitable gate dielectric material may also be employed. For example, the dielectric layer 130 may include high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

In some embodiments, the dielectric layer 130 is formed by atomic layer deposition (ALD) process. An ALD process may include growing a film(s) (e.g., the dielectric layer 130) by exposing a wafer (e.g., substrate 100) to alternating pulses (e.g., short introductions of vapor) of components, for example, a precursor and a co-reactant. The pulses may include self-limiting reactions and result in the deposition of a film and/or the chemisorbing of one or more components. Each pulse may be separated by an inert gas purge of an ALD chamber.

Figure 6:
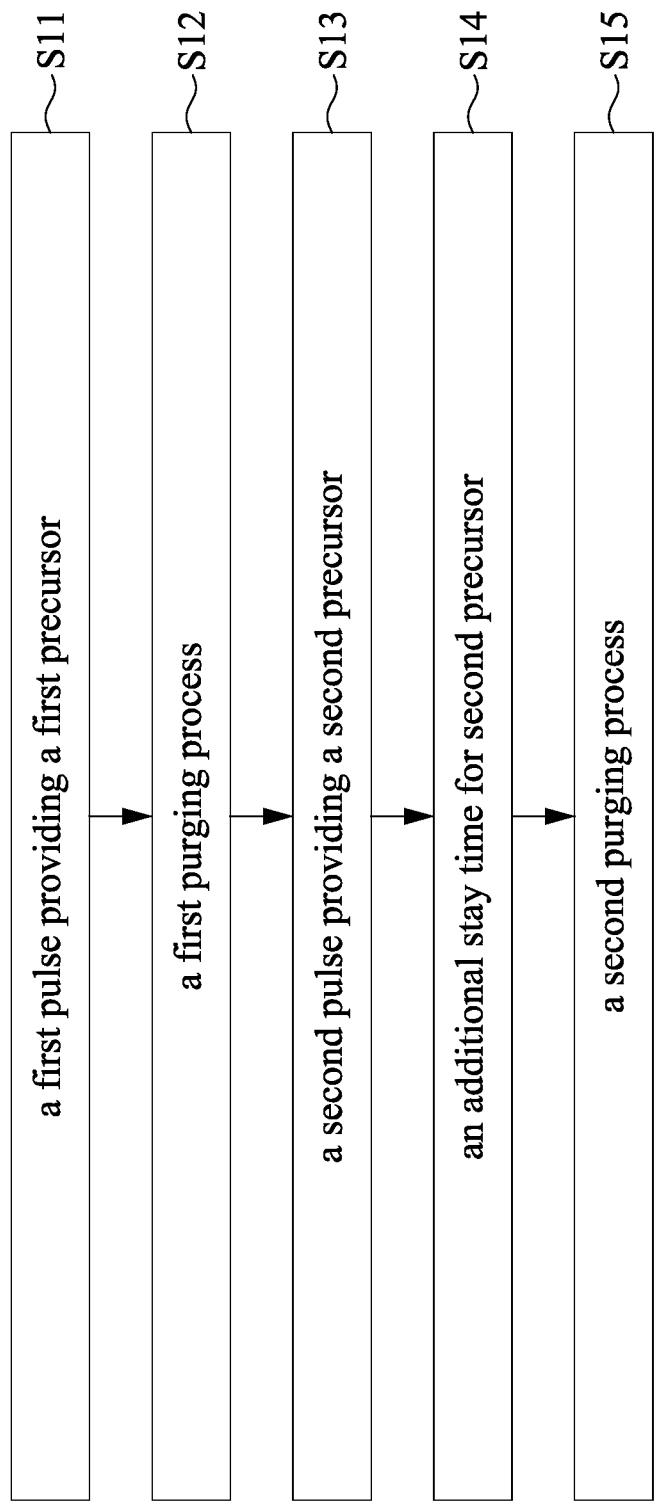
FIG. 6 illustrates a method of forming a semiconductor device in accordance with some embodiments of the present disclosure.

Reference is made to FIGS. 3A, 3B, and 6, in which FIG. 6 illustrates steps of an ALD cycle of an ALD process in accordance with some embodiments of the present disclosure. As an example where the dielectric layer 130 is made of aluminum oxide ($Al_2O_3$), each ALD cycle includes steps S11, S12, S13, S14, and S15.

The ALD cycle starts from step S11 with a first pulse providing a first precursor. In some embodiments, the first precursor may include a source of oxygen, such as $H_2O$. In some embodiments, $H_2O$ is pulsed into the ALD chamber where the wafer is placed. The water vapor may be attracted on exposed surface of the wafer (e.g., exposed surfaces of the 2-D material layer 110, the source/drain metals 120, and the substrate 100). Here, the term "first pulse" may be referred to a duration from the start of injection of the first precursor to the halt of injection of the first precursor. In some embodiments, the time duration of the first pulse is in a range from about 20 ms to about 100 ms.

The ALD cycle proceeds to step S12 with a first purging process. After the first pulse providing the first precursor, the ALD process may include a first purging process for purging excess first precursor. In some embodiments, the purging gas may be $N_2$, Ar, He, or similar inert gases.

The ALD cycle proceeds to step S13 with a second pulse providing a second precursor. In some embodiments, the second precursor may include a source of aluminum, such as trimethyl aluminum (denoted $AlMe_3$, $Al(CH_3)_3$, or TMA). The functional groups of the second precursor (e.g., TMA) react with the functional groups of the first precursor (e.g., $H_2O$) to form Al—O bonds, thereby forming a monolayer of $Al_2O_3$. Here, the term "second pulse" may be referred to a duration from the start of injection of the second precursor to the halt of injection of the second precursor. In some embodiments, the time duration of the second pulse is in a range from about 10 ms to about 50 ms.

The ALD cycle proceeds to step S14 with an additional stay time for second precursor. In some embodiments, after the second pulse providing the second precursor (or after halting the injection of the second precursor), the wafer (e.g., exposed surfaces of the 2-D material layer 110, the source/drain metals 120, and the substrate 100) is kept exposed to a gas environment of the second precursor in the ALD chamber for a non-zero time duration. That is, excess second precursor is not purged away immediately after the second pulse. Because the surface of the 2-D material layer 110 lacks dangling bonds to provide nucleation sites for the dielectric layer 130, this will result in a weak adhesion between the dielectric layer 130 and the 2-D material 110 layer. Accordingly, the additional stay time (or call soaking time) may help the second precursor to uniformly distribute over the surface of the 2-D material 110, and thus the uniformity of the dielectric layer 130 may be improved, which will also improve the device performance.

In some embodiments, the additional stay time is in a range from about 10 ms to about 40 ms. For example, the additional stay time may be about 20 ms in some embodiments. If the additional stay time is too short, the second precursor may not uniformly distribute over the surface of the 2-D material 110, and will leads to a poor uniformity of the dielectric layer 130. If the additional stay time is too long, it may not further improve the quality of the dielectric layer 130.

In some embodiments, there is no additional stay time between steps S11 and S12. That is, the first purging process is performed immediately after the first pulse of the first precursor (or after the halting the injection of the first precursor) with substantially zero time delay. In some other embodiments, there may be a stay time between the first pulse of the first precursor and the first purging process, while the stay time between the first pulse of the first precursor and the first purging process is less than the stay time (e.g., step S14) between the second pulse of the second precursor and the second purging process.

The ALD cycle proceeds to step S15 with a second purging process. After the second pulse providing the second precursor, the ALD process may include a second purging process for purging excess second precursor. In some embodiments, the purging gas may be $N_2$, Ar, He, or similar inert gases.

According to the aforementioned discussion, each ALD cycle of the ALD process for forming the dielectric layer 130 may include sequentially performing steps S11, S12, S13, S14, and S15 in FIG. 6. The ALD process may include performing the ALD cycle for several times to obtain a desired thickness of the dielectric layer 130 over the 2-D material layer 110. In some embodiments, the ALD process may include performing the ALD cycle for about 10 times to about 100 times. Accordingly, the thickness of the dielectric layer 130 may be in a range from about 5 nm to about 30 nm. For example, the dielectric layer 130 may be about 10 nm in some embodiments. If the dielectric layer 130 is too thin, dielectric layer 130 may have poor coverage over the 2-D material layer 110. If the dielectric layer 130 is too thick, the device performance may be unsatisfied due to thick gate dielectric layer.

In some embodiments, the ALD process may be performed under a temperature in a range from about 150° C. to about 180° C. If the temperature is too low, the dielectric layer 130 may not have good quality, for example, $Al_2O_3$ grains may be formed on the surface of the 2-D material layer 110. If the temperature is too high, it may inversely affect other components over the substrate 100.

Figure 4B:
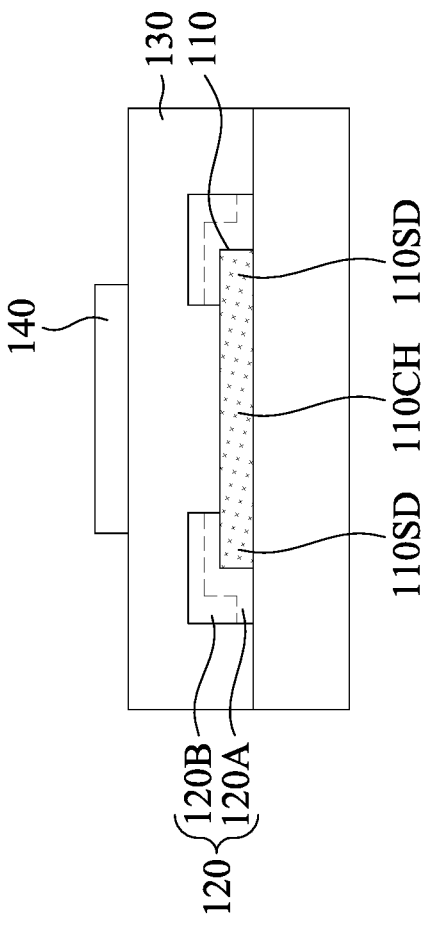
Figure 4A:
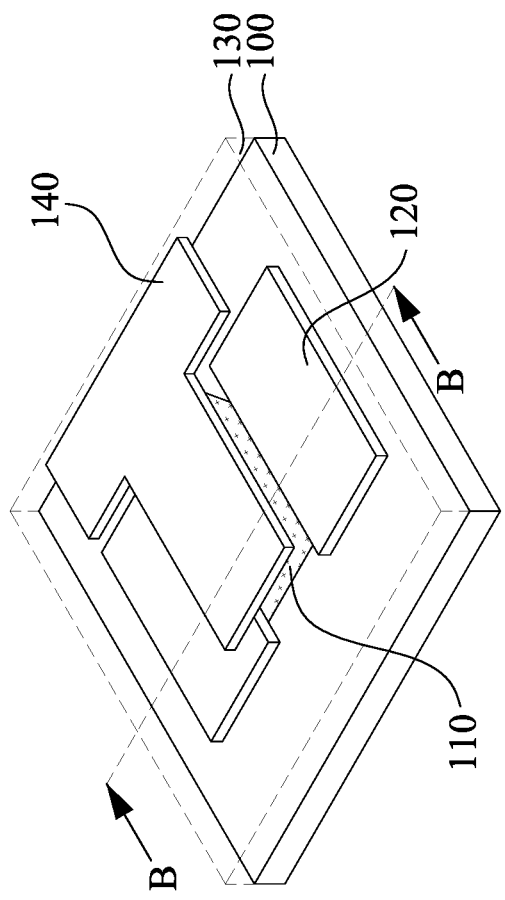

Reference is made to FIGS. 4A and 4B, in which FIG. 4A is a perspective view of a semiconductor device, and FIG. 4B is a cross-sectional view along line B-B of FIG. 4A. A gate electrode 140 is formed over the dielectric layer 130. In some embodiments, the gate electrode 140 may include a first metal layer and a second metal layer over the first metal layer. The gate electrode 140 may vertically overlaps an entirety of the channel region 110CH of the 2-D material layer 110. In some embodiments, the gate electrode 140 at least vertically overlaps portions of the source/drain metals 120 and portions of the source/drain regions 110SD of the 2-D material layer 110.

In some embodiments, the first metal layer may include metal such as gold (Au), aluminum (Al), bismuth (Bi), cadmium (Cd), chromium (Cr), iridium (Ir), niobium (Nb), tantalum (Ta), tellurium (Te), tungsten(W), or other suitable metal. In some embodiments, the second metal layer may be formed of suitable electrically conductive material, including polysilicon, graphene, and metal including one or more layers of aluminum (Al), copper (Cu), titanium (Ti), tantalum (Ta), tungsten (W), cobalt (Co), molybdenum (Mo), nickel (Ni), manganese (Mg), silver (Ag), palladium (Pd), rhenium (Re), iridium (Ir), ruthenium (Ru), platinum (Pt), zirconium (Zr), tantalum nitride (TaN), nickel silicide (NiSi), cobalt silicide (CoSi), TiN, WN, TiAl, TiAlN, TaCN, TaC, TaSiN, metal alloys, other suitable materials, and/or combinations thereof. In some embodiments, the first metal layer of the gate electrode 140 may be gold (Au) having a thickness in a range from about 90 nm to about 110 nm (e.g., about 100 nm in some embodiments). In some embodiments, the second metal layer of the gate electrode 140 may be titanium (Ti) having a thickness in a range from about 8 nm to about 12 nm (e.g., about 10 nm in some embodiments). In some embodiments, the first metal layer is thicker than the second metal layer. In some embodiments, the formation method of the gate electrode 140 may be similar to those described with respect to the source/drain metals 120, and thus relevant details will not be repeated for simplicity.

Reference is made to FIGS. 5A and 5B, in which FIG. 5A is a perspective view of a semiconductor device, and FIG. 5B is a cross-sectional view along line B-B of FIG. 5A. An interlayer dielectric (ILD) layer 150 and interconnection structures 160 are formed. At least two of the interconnection structures 160 penetrate through the ILD layer 150 and dielectric layer 130 and are electrically connected to and in contact with respective source/drain metals 120, and at least one of the interconnection structures 160 is electrically connected to and in contact with the gate electrode 140.

In some embodiments, the interlayer dielectric (ILD) layer 150 may be formed by suitable deposition process, such as CVD, PVD, ALD, or the like. Next, openings are forming in the ILD layer 150. Conductive material is formed in the openings followed by a CMP process to remove excess conductive material to form the interconnection structures 160. In some embodiments, the ILD 150 may be silicon oxide or a low-K dielectric material. The interconnection structures 160 may be copper Cu, cobalt Co, tungsten W or aluminum Al or other suitable conductive materials. In an embodiment, the interconnection structures 160 are formed through the ILD 150 using a damascene process.

In some embodiments of the present disclosure, by employing an additional stay time for a precursor in an ALD cycle for forming an oxide layer over a 2-D material surface, and by forming the oxide layer with a greater thickness, the uniformity of the oxide layer over the 2-D material surface can be improved. Accordingly, the device performance may be improved.

FIGS. 7A to 10B are cross-sectional views of a semiconductor device in various stages of fabrication in accordance with some embodiments of the present disclosure. It is noted that some elements discussed in FIGS. 7A to 10B are similar or the same as those discussed in FIGS. 1A to 6, such elements are labeled the same and relevant details will not be repeated for simplicity.

Figure 7A:
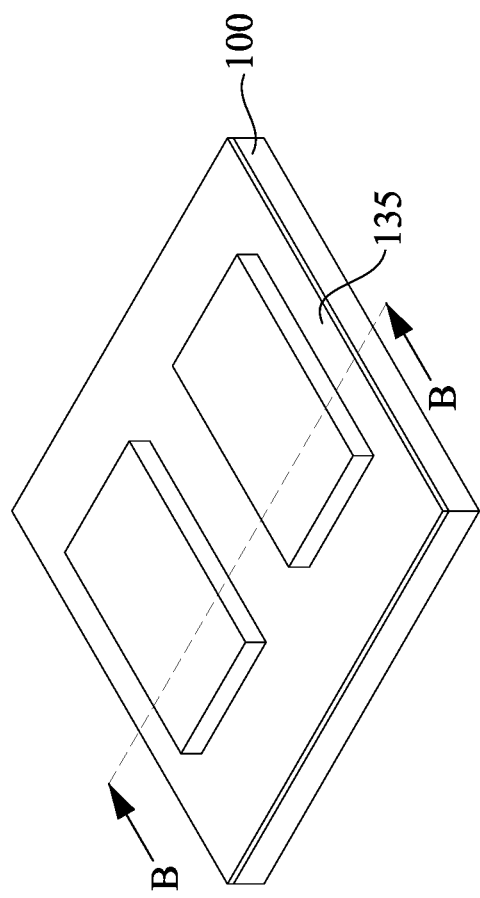
FIGS. 7A to 10B are cross-sectional views of a memory device in various stages of fabrication in accordance with some embodiments of the present disclosure.
Figure 7B:
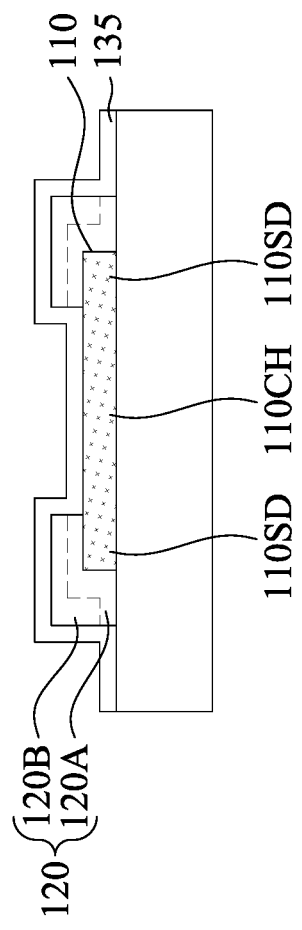

Reference is made to FIGS. 7A and 7B, in which FIG. 7A is a perspective view of a semiconductor device, and FIG. 7B is a cross-sectional view along line B-B of FIG. 7A. The structure of FIGS. 7A and 7B follows the structure shown in FIGS. 2A and 2B where a dielectric layer 135 is formed over the substrate 100. In some embodiments, the dielectric layer 135 extends along the top surface of the substrate 100, sidewalls and top surfaces of the source/drain metals 120, and the top surface of the channel region 110CH of the 2-D material layer 110. In some embodiments, the dielectric layer 135 may be formed of aluminum oxide ($Al_2O_3$), while other suitable gate dielectric material may also be employed.

In some embodiments, the dielectric layer 135 may be formed by a physical deposition process, such as thermal evaporation, electron beam (e-beam) evaporation, RF sputtering, pulsed laser deposition (PLD), and other suitable techniques. In a physical deposition process, the material to be deposited starts out as a solid and is transported to a surface (e.g., the 2-D material layer 110) where a film is slowly built up. For example, in e-beam evaporation, an electron beam is used as a power source to heat the target source to produce vaporized materials and condense on substrates. In RF sputtering, source materials are ejected from the target source and deposited on the substrate by using RF source to increase concentration of electron ionizations and lengths of electron paths thus increasing the ionization efficiency. In pulsed laser deposition (PLD), a high-power pulsed laser beam is focused inside a chamber to strike the target source of the material that is to be deposited.

Figure 8B:
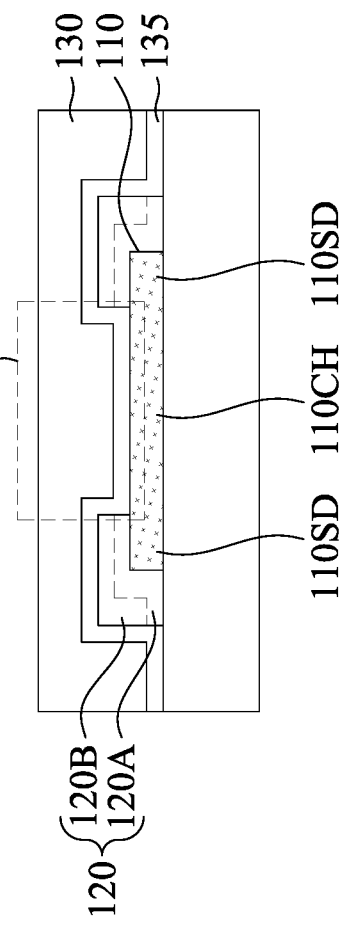
Figure 8A:
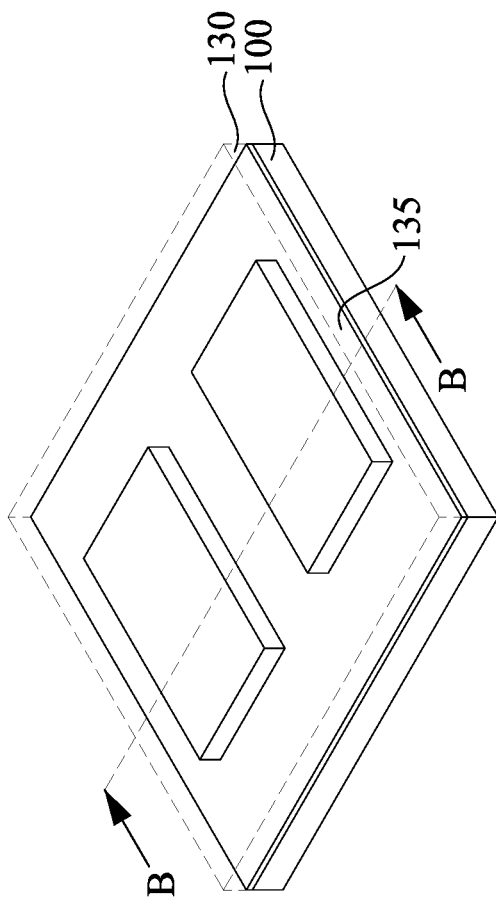

Reference is made to FIGS. 8A and 8B, in which FIG. 8A is a perspective view of a semiconductor device, and FIG. 8B is a cross-sectional view along line B-B of FIG. 8A. A dielectric layer 130 is formed over the dielectric layer 135. The formation of the dielectric layer 130 is similar to those discussed with respect to FIGS. 3A, 3B, and 6, and thus relevant details will not be repeated for simplicity. Afterward, a portion of the dielectric layer 135 and a portion of the dielectric layers 130 over the channel region 110CH of the 2-D material layer can be collectively referred to as gate dielectric 136 in the final structure. In some embodiments, the dielectric layer 130 and the dielectric layer 135 are made of the same material, such as aluminum oxide ($Al_2O_3$). In some other embodiments, the dielectric layer 130 and the dielectric layer 135 are made of different materials. For example, the dielectric layer 130 and the dielectric layer 135 may include may include high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

As mentioned above, the dielectric layer 135 is formed by a physical deposition. However, the dielectric layer 130 is formed by a chemical deposition, such as the ALD process discussed in FIGS. 3A, 3B, and 6. Here, the term "physical deposition" may refer to a deposition of film that is done by transporting a material from a target source to a substrate (e.g., the substrate 100). On the other hand, the term "chemical deposition" may refer to a deposition of film that is done by chemical reaction between at least two precursors injected into the chamber.

As mentioned above, the surface of the 2-D material layer 110 lacks dangling bonds to provide nucleation sites for the dielectric materials of the dielectric layers 130 and 135. If the dielectric material (e.g., $Al_2O_3$) is formed by a chemical deposition, such as ALD process, the precursors may be hard to uniformly distribute over the surface of the 2-D material layer 110. However, due to the nature of physical deposition, the vaporized materials or ionized materials may be "dropped over" the surface of the 2-D material layer 110, and may include better coverage over the 2-D material layer 110 than using a chemical deposition. Accordingly, the thin film of dielectric layer 135 formed by physical deposition may act as a seed layer for the following deposited dielectric layer 130, and the composite layer of the dielectric layers 130 and 135 may have better coverage and uniformity over the 2-D material layer 110.

In some embodiments of the present disclosure, using a pre-oxide deposition to form an oxide layer (e.g., the dielectric layer 135) may improve the coverage of the composite dielectric layer (e.g., the dielectric layers 135 and 130) over a 2-D material surface. Furthermore, by combining a physical deposition and a chemical deposition, it is possible to avoid the issue of precursor distribution on a 2-D material surface with the help of physically deposited thin oxide layer, and still obtain a flat dielectric layer through the chemical deposition. In this way, the device performance may be improved. For example, the gate leakage currents may be suppressed.

In some embodiments, the dielectric layer 130 is thicker than the dielectric layer 135. In some embodiments, the thickness of the dielectric layer 135 may be in a range from about 1 nm to about 10 nm. For example, the dielectric layer 135 may be about 5 nm in some embodiments. In some embodiments, the dielectric layer 130 may be in a range from about 5 nm to about 30 nm. For example, the dielectric layer 135 may be about 20 nm in some embodiments. In some embodiments, the total thickness of the dielectric layers 135 and 130 may be in a range from about 20 nm to about 30 nm. For example, the total thickness of the dielectric layers 135 and 130 may be about 25 nm in some embodiments.

Figure 9A:
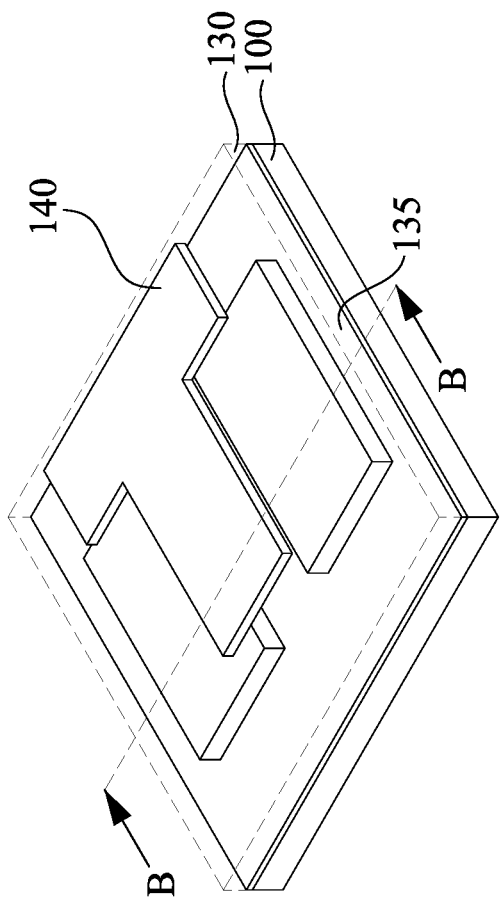
Figure 9B:
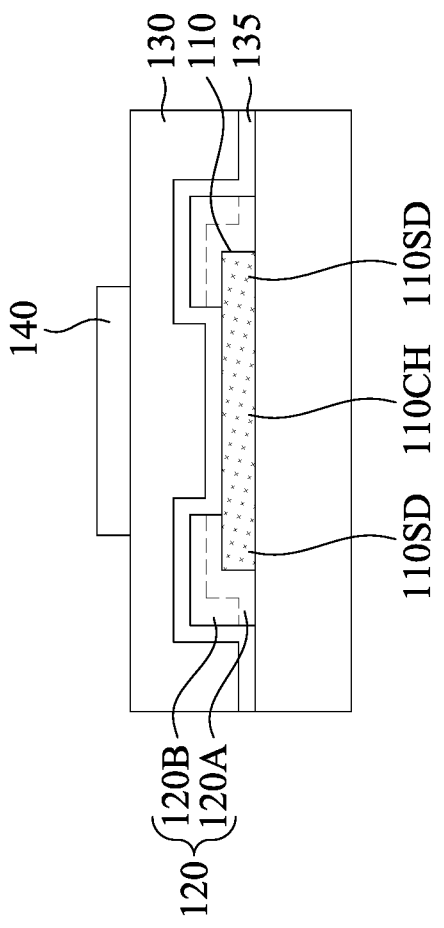

Reference is made to FIGS. 9A and 9B, in which FIG. 9A is a perspective view of a semiconductor device, and FIG. 9B is a cross-sectional view along line B-B of FIG. 9A. A gate electrode 140 is formed over the dielectric layer 130.

Figure 10B:
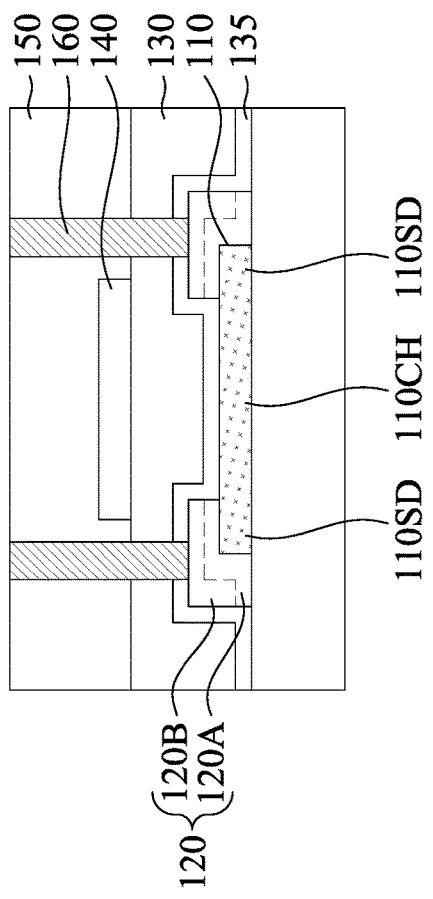
Figure 10A:
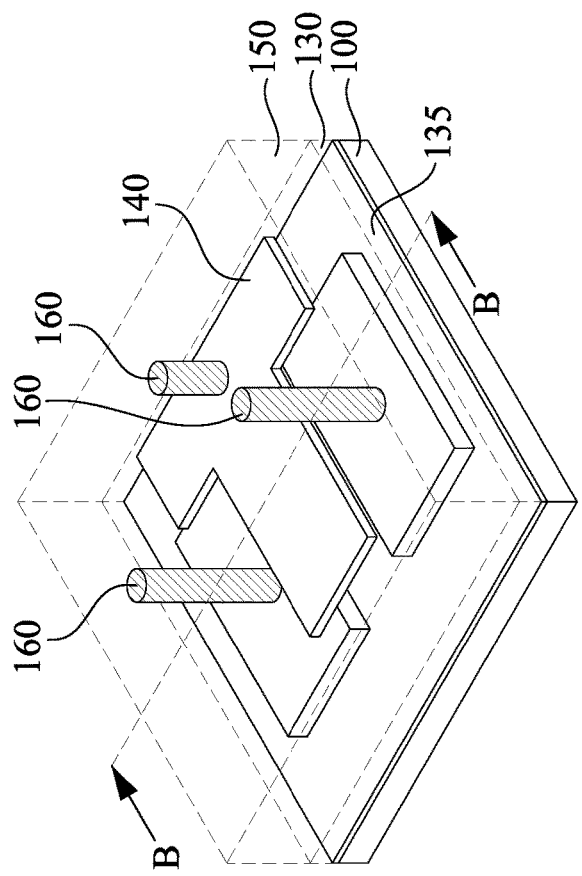

Reference is made to FIGS. 10A and 10B, in which FIG. 10A is a perspective view of a semiconductor device, and FIG. 10B is a cross-sectional view along line B-B of FIG. 10A. An interlayer dielectric (ILD) layer 150 and interconnection structures 160 are formed. At least two of the interconnection structures 160 penetrate through the ILD layer 150 and dielectric layers 130, 135 and are electrically connected to and in contact with respective source/drain metals 120, and at least one of the interconnection structures 160 is electrically connected to and in contact with the gate electrode 140.

Figure 11:
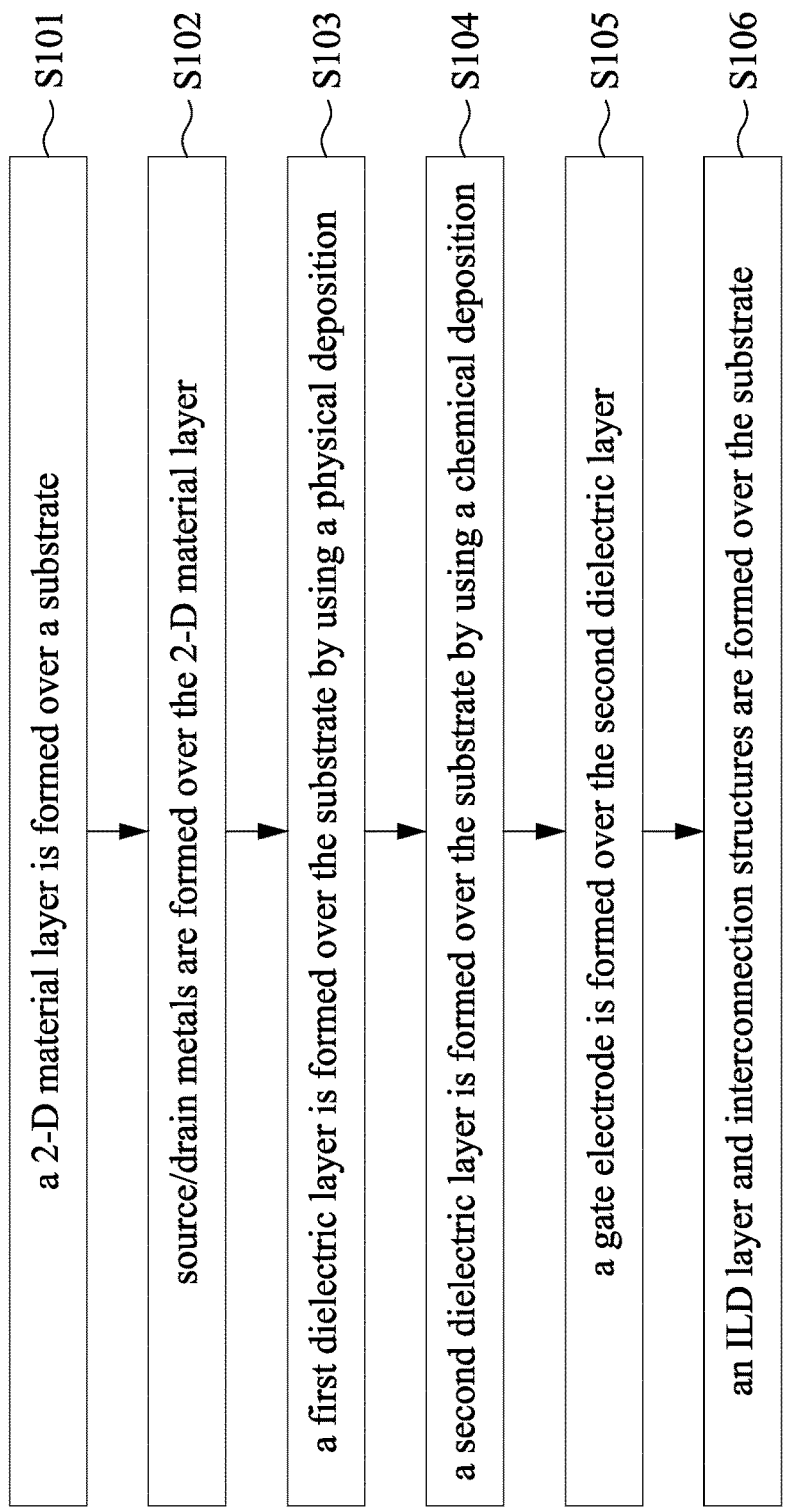
FIG. 11 illustrates a method of forming a semiconductor device in accordance with some embodiments of the present disclosure.

FIG. 11 illustrates a method M1 of forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At step S101, a 2-D material layer is formed over a substrate. FIGS. 1A and 1B illustrate a perspective view and a cross-sectional view of some embodiments corresponding to act in step S101.

At step S102, source/drain metals are formed over the 2-D material layer. FIGS. 2A and 2B illustrate a perspective view and a cross-sectional view of some embodiments corresponding to act in step S102.

At step S103, a first dielectric layer is formed over the substrate by using a physical deposition. FIGS. 7A and 7B illustrate a perspective view and a cross-sectional view of some embodiments corresponding to act in step S103.

At step S104, a second dielectric layer is formed over the substrate by using a chemical deposition. FIGS. 3A, 3B, 8A and 8B illustrate a perspective view and a cross-sectional view of some embodiments corresponding to act in step S104.

At step S105, a gate electrode is formed over the second dielectric layer. FIGS. 4A, 4B, 9A and 9B illustrate a perspective view and a cross-sectional view of some embodiments corresponding to act in step S105.

At step S106, an ILD layer and interconnection structures are formed over the substrate. FIGS. 5A, 5B, 10A and 10B illustrate a perspective view and a cross-sectional view of some embodiments corresponding to act in step S106.

FIGS. 12A to 18B are cross-sectional views of a memory device in various stages of fabrication in accordance with some embodiments of the present disclosure. It is noted that some elements discussed in FIGS. 12A to 18B are similar or the same as those discussed in FIGS. 1A to 10B, such elements are labeled the same and relevant details will not be repeated for simplicity.

Reference is made to FIGS. 12A and 12B, in which FIG. 12A is a perspective view of a semiconductor device, and FIG. 12B is a cross-sectional view along line B-B of FIG. 12A. A 2-D material layer 110 is formed over a substrate 100.

Figure 13B:
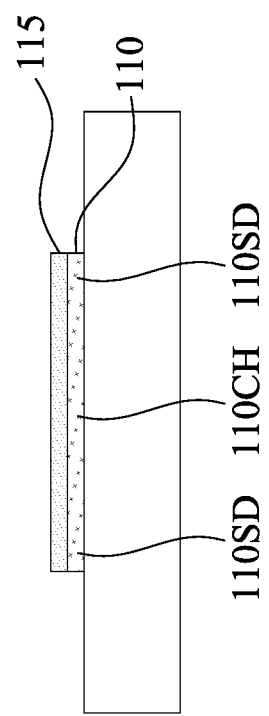
Figure 13A:
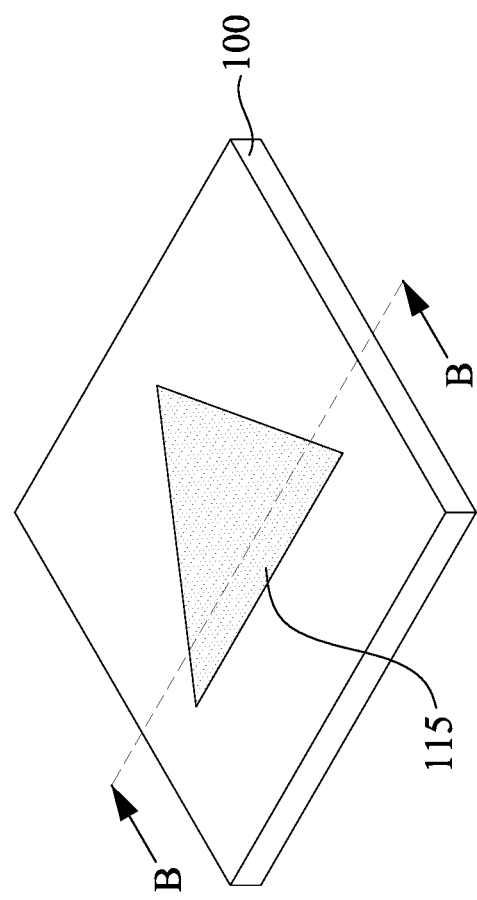

Reference is made to FIGS. 13A and 13B, in which FIG. 13A is a perspective view of a semiconductor device, and FIG. 13B is a cross-sectional view along line B-B of FIG. 13A. A 2-D material layer 115 is formed over the 2-D material layer 110. In some embodiments, the 2-D material layer 115 is selective grown on the 2-D material layer 110. Because the 2-D material layer 115 is selectively formed over the 2-D material layer 110 sidewalls of the 2-D material layer 115 may be coterminous with respective sidewalls of the 2-D material layer 110. In some embodiments, the 2-D material layer 115 may include antimonene, graphene, germanene, stanene, or the like. Specifically, antimonene is the 2-D allotrope of antimony (Sb), germanene is the 2-D allotrope of germanium (Ge), and stanene is the 2-D allotrope of tin (Sn), respectively.

The 2-D material layer 115 is different from the 2-D material layer 110 at least in the composition. The 2-D material layer 115 may be suitable 2D material and may be deposited using processes suitable for the 2-D material layer 115. In an example, the 2-D material layer 115 may be formed with a semimetal electronic property or may be treated to exhibit a semimetal property. As used herein, a semimetal electronic property ("semimetal property") refers to an absence of a bandgap and a negligible density of states at the Fermi level. A semimetal material or a semimetal state of a material has both holes and electrons that contribute to electrical conduction and is conductive. On the other hand, the 2-D material layer 110 may be formed with semiconductor properties.

In some embodiments where the 2-D material layer 115 is made of antimonene (Sb), the 2-D material layer 115 may be grown over the 2-D material layer 110 using thermal evaporation, molecular beam epitaxy (MBE) or physical vapor deposition (PVD) processes with a growth temperature ranging from 100° C. to about 150° C. (e.g., about 120° C.) for a time duration ranging from about 10 seconds to about 600 seconds. This growth temperature range supports the selective growth of the antimonene over the 2-D material layer 110 without formation of antimonene over the exposed surface of the substrate 100. As such, the deposition of the antimonene precursors may be globally conducted over the whole surface of the substrate 100 without differentiation between the 2-D material layer 110 and the surface of the substrate 100. With the controlled growth temperatures within 150° C. to about 300° C., the selective growth of the antimonene layer 115 only over the 2-D material layer 110 may be achieved. In some embodiments, with the 2-D material layer 115 formed satisfactorily, the 2-D material layer 115 may follow the pattern of the 2-D material layer 110. That is, the 2-D material layer 115 may completely overlap the 2-D material layer 110.

In some embodiments, the 2-D material layer 115 may be treated so that it exhibits the desired electronic properties. For example, a thickness of 2-D material layer 115 is controlled such that the 2-D material layer 115 exhibits electronic properties suitable for the design and application requirements. In an example, the thickness of the 2-D material layer 115 may be controlled by adjusting the time duration of the growth process, e.g., the MBE and/or the TBC procedures. For example, a longer MBE process will produce a thicker 2-D material layer 115 initially, namely more layers of monolayer. The thickness may be further controlled by a thinning process to reduce the number of monolayers of the 2-D material layer 115, such as by plasma-based dry etching, e.g., a reactive-ion etching. In some embodiments, the thickness of the 2-D material layer 115 may be in a range from about 90 nm to about 110 nm. For example, the thickness of the 2-D material layer 115 may be about 100 nm in some embodiments.

Reference is made to FIGS. 14A and 14B, in which FIG. 14A is a perspective view of a semiconductor device, and FIG. 14B is a cross-sectional view along line B-B of FIG. 14A. Source/drain metals 120 are formed on opposite sides of the 2-D material layer 115, while exposing a center portion of the 2-D material layer 115. In some embodiments, the source/drain metals 120 extend from the top surface of the 2-D material layer 115, along the sidewalls of the 2-D material layers 115, 110, to a top surface of the substrate 100.

The source/drain metals 120 may be gold (Au), tungsten (W), cobalt (Co) or other suitable metal/conductive materials for terminal electrodes. Other suitable metal/conductive materials for terminal electrodes include ruthenium, palladium, platinum, nickel, and/or conductive metal oxides and other suitable materials for P-type metal materials, and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials. The formation and the materials of the source/drain metals 120 may be similar or the same as the source/drain metals 120 described in FIGS. 2A and 2B, and thus relevant details will not be repeated for simplicity.

Reference is made to FIGS. 15A and 15B, in which FIG. 15A is a perspective view of a semiconductor device, and FIG. 15B is a cross-sectional view along line B-B of FIG. 15A. The 2-D material layer 115 (see FIGS. 14A and 14B) is patterned by using the source/drain metals 120 as a hard mask (etching mask). In greater detail, the 2-D material layer 115 exposed by the source/drain metals 120 are removed, and the remaining portions of the 2-D material layer 115 denote the 2-D material layers 116. In some embodiments, the 2-D material layer 115 may patterned by using etching process, the etching is selective with respect to the portions of the 2-D material layer 115 underlying the source/drain metals 120. In some embodiments, the etching process may include dipping the structure over the substrate 100 into a basic solution, such as potassium hydroxide (KOH) solution, sodium hydroxide (NaOH) solution, for about 50 sec to about 70 sec (e.g., 60 sec).

In some embodiments, the 2-D material layers 116 and the source/drain metals 120 may collectively serve as source/drain electrode in the final structure. In some embodiments, each of the 2-D material layers 116 is thinner than the source/drain metals 120.

Reference is made to FIGS. 16A and 16B, in which FIG. 16A is a perspective view of a semiconductor device, and FIG. 16B is a cross-sectional view along line B-B of FIG. 16A. A dielectric layer 135 is formed over the substrate 100. In some embodiments, the dielectric layer 135 is in contact with the top surface of the 2-D material layer 110, sidewalls of the 2-D material layers 116, and sidewalls of the source/drain metals 120.

Reference is made to FIGS. 17A and 17B, in which FIG. 17A is a perspective view of a semiconductor device, and FIG. 17B is a cross-sectional view along line B-B of FIG. 17A. A dielectric layer 130 is formed over the dielectric layer 135.

Reference is made to FIGS. 18A and 18B, in which FIG. 18A is a perspective view of a semiconductor device, and FIG. 18B is a cross-sectional view along line B-B of FIG. 18A. A gate electrode 140 is formed over the dielectric layer 135, and an interlayer dielectric (ILD) layer 150 and interconnection structures 160 are formed.

In some embodiments of the present disclosure, by forming a 2-D material conductive layer serving as source/drain electrode over a 2-D material semiconductor layer, the contact resistance between the 2-D material semiconductor layer and the source/drain electrode may be reduced, which will improve the device performance. For example, the drain current of the device under $V_{DS}=2V$ may increases to about $4 \times 10^4$ µA. Also, leakage current between the source/drain electrodes may also be reduced, which will increase the On/Off ratio of the device.

Figure 19:
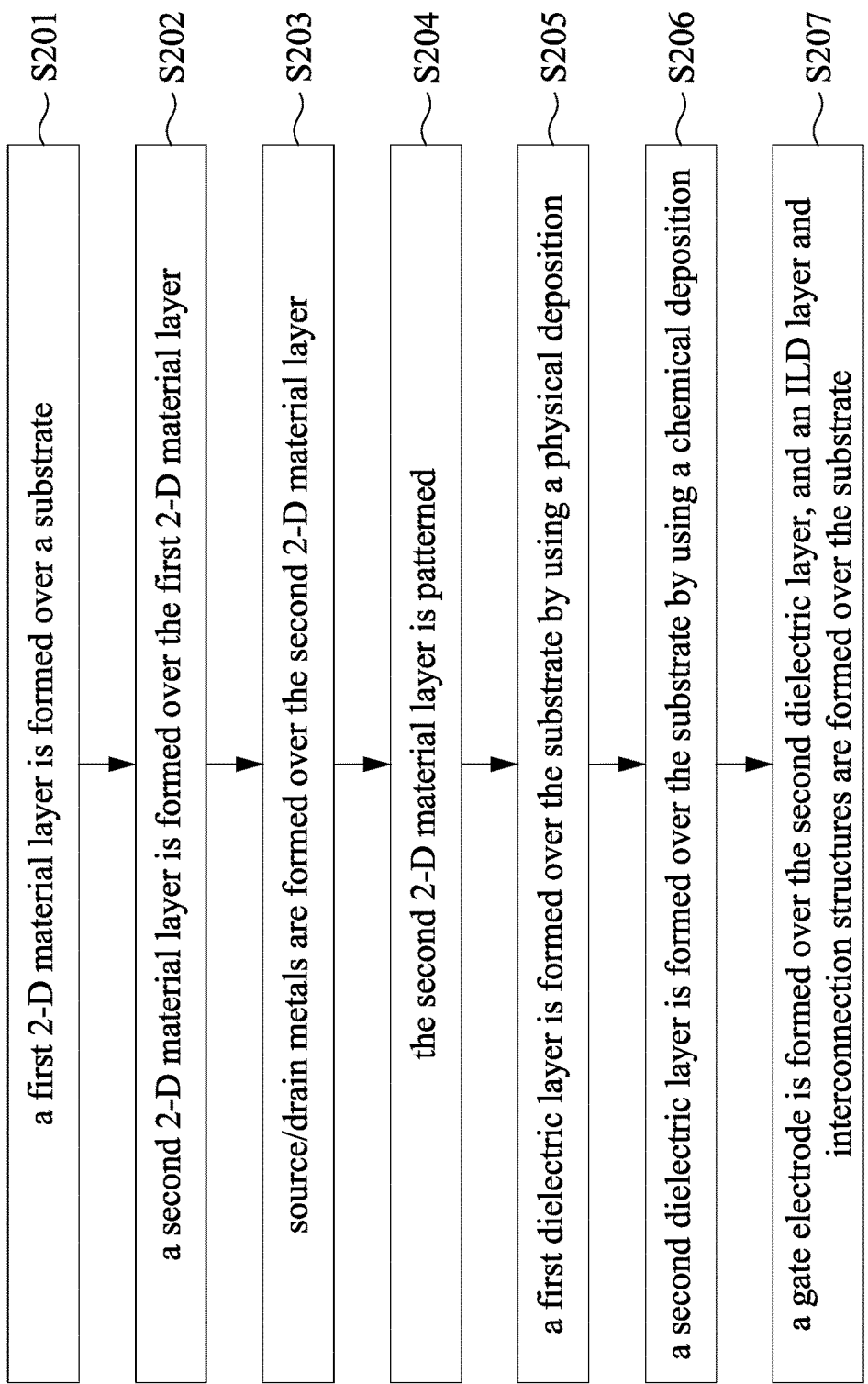
FIG. 19 illustrates a method of forming a semiconductor device in accordance with some embodiments of the present disclosure.

FIG. 19 illustrates a method M2 of forming a semiconductor device in accordance with some embodiments of the present disclosure. Although the method M2 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At step S201, a first 2-D material layer is formed over a substrate. FIGS. 12A and 12B illustrate a perspective view and a cross-sectional view of some embodiments corresponding to act in step S201.

At step S202, a second 2-D material layer is formed over the first 2-D material layer. FIGS. 13A and 13B illustrate a perspective view and a cross-sectional view of some embodiments corresponding to act in step S202.

At step S203, source/drain metals are formed over the second 2-D material layer. FIGS. 14A and 14B illustrate a perspective view and a cross-sectional view of some embodiments corresponding to act in step S203.

At step S204, the second 2-D material layer is patterned. FIGS. 15A and 15B illustrate a perspective view and a cross-sectional view of some embodiments corresponding to act in step S204.

At step S205, a first dielectric layer is formed over the substrate by using a physical deposition. FIGS. 16A and 16B illustrate a perspective view and a cross-sectional view of some embodiments corresponding to act in step S205.

At step S206, a second dielectric layer is formed over the substrate by using a chemical deposition. FIGS. 17A and 17B illustrate a perspective view and a cross-sectional view of some embodiments corresponding to act in step S206.

At step S207, a gate electrode is formed over the second dielectric layer, and an ILD layer and interconnection structures are formed over the substrate. FIGS. 18A and 18B illustrate a perspective view and a cross-sectional view of some embodiments corresponding to act in step S207.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that by employing an additional stay time for a precursor in an ALD cycle for forming an oxide layer over a 2-D material surface, and by forming the oxide layer with a greater thickness, the uniformity of the oxide layer over the 2-D material surface can be improved. Another advantage is that by using a pre-oxide deposition to form an oxide layer may improve the coverage of the composite dielectric layer over a 2-D material surface. Furthermore, by combining a physical deposition and a chemical deposition, it is possible to avoid the issue of precursor distribution on a 2-D material surface with the help of physically deposited thin oxide layer, and still obtain a flat dielectric layer through the chemical deposition. Yet another advantage is that by forming a 2-D material conductive layer serving as source/drain electrode over a 2-D material semiconductor layer, the contact resistance between the 2-D material semiconductor layer and the source/drain electrode may be reduced, which will improve the device performance.

In some embodiments of the present disclosure, a method includes forming a 2-D material semiconductor layer over a substrate; forming source/drain electrodes covering opposite sides of the 2-D material semiconductor layer, while leaving a portion of the 2-D material semiconductor layer exposed by the source/drain electrodes; forming a first gate dielectric layer over the portion of the 2-D material semiconductor layer by using a physical deposition process; forming a second gate dielectric layer over the first gate dielectric layer by using a chemical deposition process, in which a thickness of the first gate dielectric layer is less than a thickness of the second gate dielectric layer; and forming a gate electrode over the second gate dielectric layer.

In some embodiments of the present disclosure, a method includes forming a 2-D material semiconductor layer over a substrate; forming source/drain electrodes covering opposite sides of the 2-D material semiconductor layer, while leaving a portion of the 2-D material semiconductor layer exposed by the source/drain electrodes; forming a first gate dielectric layer over the portion of the 2-D material semiconductor layer by using an atomic layer deposition (ALD) process; and forming a gate electrode over the first gate dielectric layer. The ALD process includes at least one ALD cycle each including injecting a first precursor into an ALD chamber for a first duration; halting injecting the first precursor into an ALD chamber; purging the first precursor in the ALD chamber; injecting a second precursor into the ALD chamber for a second duration; halting injecting the second precursor into the ALD chamber; and purging the second precursor in the ALD chamber, in which a non-zero time duration is between halting injecting the second precursor and purging the second precursor.

In some embodiments of the present disclosure, a semiconductor device includes a substrate, a 2-D material semiconductor layer, source/drain electrodes, a first gate dielectric layer, a gate electrode. The 2-D material semiconductor layer is over the substrate. The source/drain electrodes cover opposite sides of the first 2-D material, in which each of the source/drain electrodes includes a 2-D material semimetal layer and a metal over the 2-D material semimetal layer. The first gate dielectric layer covers the 2-D material semiconductor layer and the source/drain electrodes. The gate electrode is over the first gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a 2-D material semiconductor layer over a substrate;
    forming source/drain electrodes covering opposite sides of the 2-D material semiconductor layer, while leaving a portion of the 2-D material semiconductor layer exposed by the source/drain electrodes;
    forming a first gate dielectric layer over the portion of the 2-D material semiconductor layer by a physical deposition process;
    forming a second gate dielectric layer over the first gate dielectric layer by a chemical deposition process, wherein a thickness of the first gate dielectric layer is less than a thickness of the second gate dielectric layer, and wherein the chemical deposition process comprises an atomic layer deposition (ALD) process, wherein the ALD process comprises at least one ALD cycle each comprising:
        injecting an oxygen source into an ALD chamber for a first duration;
        halting injecting the oxygen source into the ALD chamber;
        purging the oxygen source in the ALD chamber;
        injecting a metal source into the ALD chamber for a second duration;
        halting injecting the metal source into the ALD chamber; and
        purging the metal source in the ALD chamber, wherein a time duration between halting injecting the oxygen source and beginning purging the oxygen source is less than a time duration between halting injecting the metal source and beginning purging the metal source; and
    forming a gate electrode over the second gate dielectric layer.

2. The method of claim 1, wherein the physical deposition process comprises electron beam (e-beam) evaporation, RF sputtering, or pulsed laser deposition (PLD).

3. The method of claim 1, further comprising:
    prior to forming the source/drain electrodes, forming a 2-D material semimetal layer over the 2-D material semiconductor layer, wherein forming the source/drain electrodes is performed such that a portion of the 2-D material semimetal layer is exposed by the source/drain electrodes; and
    after forming the source/drain electrodes, removing the portion of the 2-D material semimetal layer to expose the 2-D material semiconductor layer.

4. The method of claim 3, wherein forming the first gate dielectric layer is performed such that the first gate dielectric layer is in contact with sidewalls of remaining portions of the 2-D material semimetal layer.

5. The method of claim 1, wherein forming the source/drain electrodes comprises:
    forming a first metal layer; and
    forming a second metal layer over the first metal layer, wherein the first metal layer is thicker than the second metal layer.

6. The method of claim 1, further comprising, after forming the gate electrode, forming interconnection structures extending through the first and second gate dielectric layers to contact the source/drain electrodes, respectively.

7. The method of claim 1, wherein forming the gate electrode comprises:
    forming a first metal layer; and
    forming a second metal layer over the first metal layer, wherein the first metal layer is thicker than the second metal layer.

8. A method, comprising:
    forming a 2-D material semiconductor layer over a substrate;
    forming source/drain electrodes covering opposite sides of the 2-D material semiconductor layer, while leaving a portion of the 2-D material semiconductor layer exposed by the source/drain electrodes;
    forming a first gate dielectric layer over the portion of the 2-D material semiconductor layer by using an atomic layer deposition (ALD) process, wherein the ALD process comprises at least one ALD cycle each comprising:
        injecting a first precursor into an ALD chamber for a first duration;
        halting injecting the first precursor into the ALD chamber;
        purging the first precursor in the ALD chamber, wherein purging the first precursor is performed after halting injecting the first precursor without time delay;
        after purging the first precursor, injecting a second precursor into the ALD chamber for a second duration;
        halting injecting the second precursor into the ALD chamber; and
        purging the second precursor in the ALD chamber, wherein a non-zero time duration is between halting injecting the second precursor and purging the second precursor, and wherein a time duration between halting injecting the first precursor and beginning purging the first precursor is less than a time duration between halting injecting the second precursor and beginning purging the second precursor; and
    forming a gate electrode over the first gate dielectric layer.

9. The method of claim 8, wherein the 2-D material semiconductor layer comprises tungsten diselenide ($WSe_2$), and the first gate dielectric layer comprises aluminum oxide ($Al_2O_3$).

10. The method of claim 8, further comprising forming a second gate dielectric layer over the portion of the 2-D material semiconductor layer prior to forming the first gate dielectric layer, wherein the first gate dielectric layer is thicker than the second gate dielectric layer.

11. The method of claim 10, wherein the second gate dielectric layer is formed by a physical deposition process.

12. The method of claim 8, further comprising:
    prior to forming the source/drain electrodes, forming a 2-D material semimetal layer over the 2-D material semiconductor layer, wherein forming the source/drain electrodes is performed such that a portion of the 2-D material semimetal layer is exposed by the source/drain electrodes; and
    after forming the source/drain electrodes, removing the portion of the 2-D material semimetal layer to expose the 2-D material semiconductor layer.

13. The method of claim 8, wherein the non-zero time duration is in a range from about 10 ms to about 40 ms.

14. A method, comprising:

forming a 2-D material semiconductor layer over a substrate;

forming source/drain electrodes covering opposite sides of the 2-D material semiconductor layer, wherein each of the source/drain electrodes comprises a 2-D material semimetal layer and a metal over the 2-D material semimetal layer;

forming a first gate dielectric layer covering the 2-D material semiconductor layer and the source/drain electrodes, wherein the first gate dielectric layer is formed through a chemical deposition process comprising:

injecting an oxygen source into an ALD chamber for a first duration;

halting injecting the oxygen source into the ALD chamber;

purging the oxygen source in the ALD chamber;

after purging the oxygen source, injecting a metal source into the ALD chamber for a second duration;

halting injecting the metal source into the ALD chamber; and purging the metal source in the ALD chamber, wherein a time duration between halting injecting the oxygen source and beginning purging the oxygen source is less than a time duration between halting injecting the metal source and beginning_purging the metal source, and wherein the metal source is not purged away immediately after halting injecting the metal source into the ALD chamber; and forming a gate electrode over the first gate dielectric layer.

15. The method of claim 14, wherein the 2-D material semimetal layer is thinner than the metal.

16. The method of claim 14, wherein the first gate dielectric layer is in contact with the 2-D material semimetal layer of the source/drain electrodes.

17. The method of claim 14, further comprising forming a second gate dielectric layer over the 2-D material semiconductor layer prior to forming the first gate dielectric layer, wherein the first gate dielectric layer is thicker than the second gate dielectric layer.

18. The method of claim 17, wherein a thickness of the first gate dielectric layer is in a range from about 5 nm to about 30 nm.

19. The method of claim 8, wherein the first precursor comprises oxygen and the second precursor comprises aluminum.

20. The method of claim 14, wherein the time duration between halting injecting the oxygen source and purging the oxygen source is zero.

* * * * *